United States Patent [19]

Yamazaki et al.

[11] Patent Number: 5,247,191
[45] Date of Patent: Sep. 21, 1993

[54] SEMICONDUCTOR DEVICE

[75] Inventors: Shunpei Yamazaki, Tokyo; Akira Mase, Kanagawa, both of Japan

[73] Assignee: Semiconductor Energy Laboratory Co., Ltd., Kanagawa, Japan

[21] Appl. No.: 739,333

[22] Filed: Aug. 1, 1991

[30] Foreign Application Priority Data

Aug. 2, 1990 [JP] Japan .................. 2-205392

[51] Int. Cl.⁵ .................. H01L 23/48; H01L 27/14
[52] U.S. Cl. ............................ 257/72; 257/83; 257/223
[58] Field of Search ............... 357/71, 74, 30, 23.7; 257/223, 83, 72

[56] References Cited

U.S. PATENT DOCUMENTS

| | | | |
|---|---|---|---|
| 4,581,623 | 4/1986 | Wang | 357/23.7 |
| 4,654,683 | 3/1987 | Anagnostopoulous et al. | 257/223 |
| 4,688,074 | 8/1987 | Iinuma | 357/80 |
| 4,826,297 | 5/1989 | Kubo et al. | 357/80 |
| 4,862,237 | 8/1989 | Morozumi | 257/72 |
| 5,014,096 | 5/1991 | Matsuda et al. | 257/83 |
| 5,032,887 | 7/1991 | Oliveri et al. | 357/68 |
| 5,040,034 | 8/1991 | Murakami et al. | 357/68 |
| 5,043,790 | 8/1991 | Butler | 357/65 |
| 5,051,808 | 9/1991 | Saito et al. | 357/23.7 |
| 5,070,388 | 12/1991 | Wade et al. | 357/68 |
| 5,084,905 | 1/1992 | Sasaki et al. | 357/68 |

FOREIGN PATENT DOCUMENTS 55-113344 9/1980 Japan .

Primary Examiner—Eugene R. LaRoche
Assistant Examiner—Viet Q. Nguyen
Attorney, Agent, or Firm—Sixbey, Friedman, Leedom & Ferguson

[57] ABSTRACT

A semiconductor device. A depression is formed in an insulating portion of a substrate and an electric lead is formed in the depression so that at least a portion of the electric lead is buried in the substrate. A semiconductor device is formed on the substrate and connected to the electric lead. The electric lead may be an extension of a source electrode, a drain electrode, or a gate electrode of the semiconductor device. Also, a gate electrode, a source electrode, or a drain electrode may be buried in a substrate.

19 Claims, 8 Drawing Sheets

SEMICONDUCTOR DEVICE

BACKGROUND OF THE INVENTION

1. Field of the Invention

The present invention relates to a semiconductor device provided on an insulating surface of a substrate.

2. Description of the Prior Art

Figure 6A:
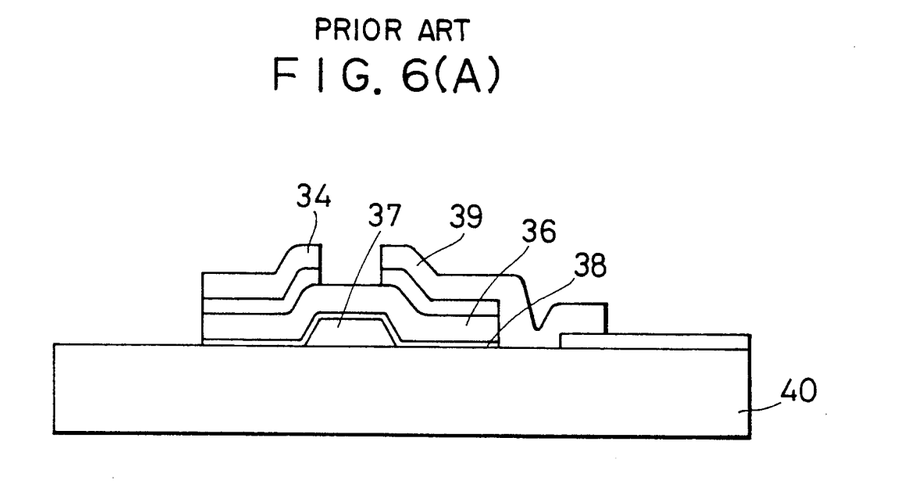
FIGS. 6(A) through 6(B) show a cross section and a plan of a conventional active matrix type semiconductor device.

In recent years, liquid crystal electro-optical devices, specifically liquid crystal display devices, have been substituted for CRT, due to demands for thin and light devices. Particularly, liquid crystal displays in which nematic liquid crystal, ferroelectric liquid crystal, polymer dispersed liquid crystal, or the like is driven by the use of thin film transistors (simply referred to as TFT hereinafter) of active matrix type have been developed and utilized in the field of large-sized projection TVs, large-sized plane TVs, and color displays for personal computers. The active matrix TFT utilized for a liquid crystal display is manufactured by providing electric leads, electrodes, an insulating layer and the like on a glass substrate by sputtering, vacuum deposition method, CVD, and the like. An example of structure of a conventional active matrix device is illustrated in FIG. 6(A). This active matrix device is an inverse stagger type insulated gate field effect transistor where a gate electrode 37 is provided on a substrate 40 and further an insulating layer 38, a semiconductor layer 36, and electrodes 34, 39 are provided thereon.

In such an active matrix TFT, a gate lead 35 connected to the gate electrode 37 and a source lead 41 connected to the source electrode 34 are necessarily crossed over the substrate. In order to prevent the gate lead 35 and source lead 41 from being electrically connected to each other at the solid crossings, an insulating film is inserted between the gate lead 35 and the source lead 41 in general. However, depending on the structure and quality of the inserted insulating film, current leakage might occur between the gate lead 35 and the source lead 41 at the solid crossings. For this reason, a thick insulating film has to be provided to prevent the leakage.

Figure 6B:
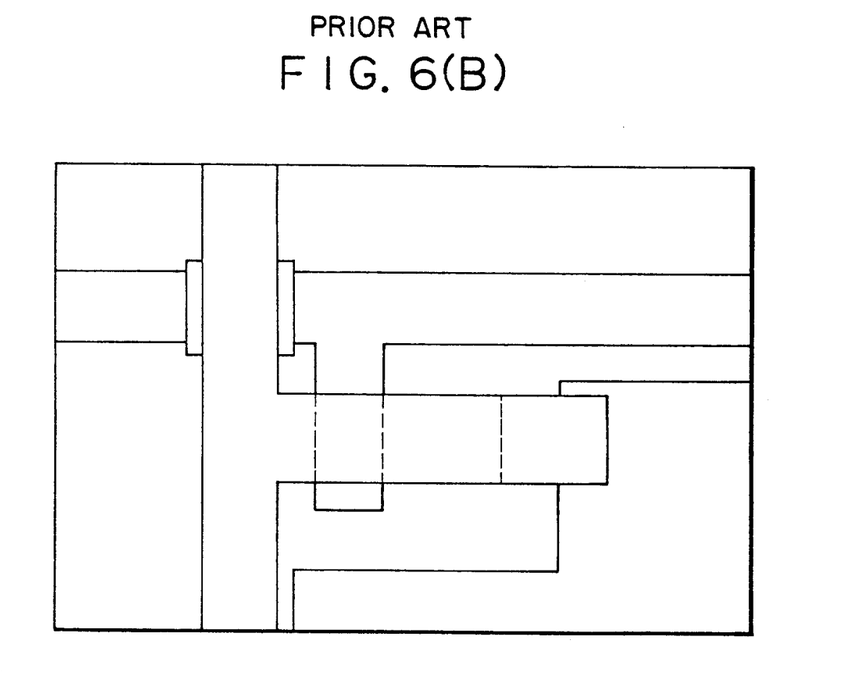

However, the more the thickness of the insulating film is increased, the larger the difference in height between a lower lead and an upper lead becomes. Accordingly, disconnection of the upper lead (i.e. source lead 41 in the case of FIG. 6(B)) is probable, as known as a step coverage problem in the semiconductor field. Further, when such a thin film transistor is utilized in a liquid crystal display device, the height of the solid crossings and that of a display electrode 39 becomes different. That means, when two substrates are mated to compose a liquid crystal cell, the thickness of the cell becomes ununiform. This results in color shade and degradation of display. From the above reason, a technique to thin solid crossings, i.e. a technique to make the thickness of an active matrix type liquid crystal cell uniform, has been required.

SUMMARY OF THE INVENTION

It is an object of the present invention to provide a semiconductor device suitable for use in a liquid crystal cell.

It is another object of the present invention to provide a semiconductor device with low protrusions.

In order to attain the above and other objects, at least a part of a conductive electric lead or gate, source, or drain electrode is provided in an insulating substrate in a semiconductor device in accordance with the present invention.

Figure 5:
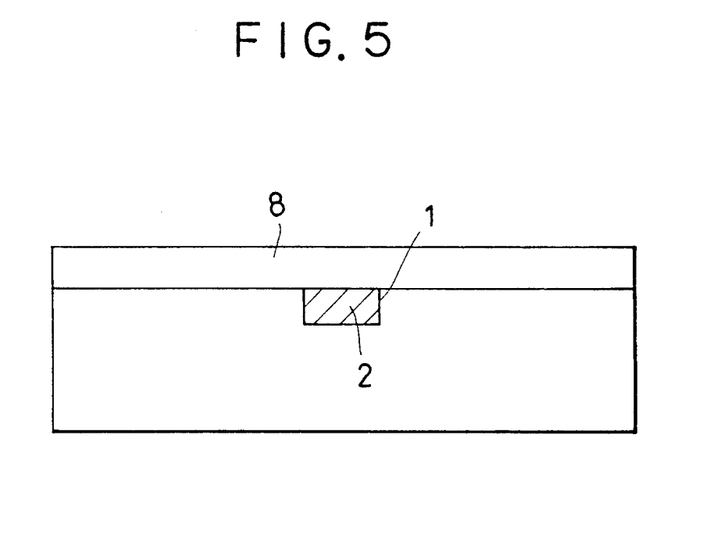
FIG. 5 is a schematic cross sectional view showing structure of a substrate in accordance with the present invention.

A typical structure of a substrate in accordance with the present invention is illustrated in FIG. 5. An insulating substrate having a planar surface is processed to form a depression 1, and in the depression 1, an electric lead 2 made of a conductive material or an electrode 2 is provided. Then, a portion of the substrate surface necessary to be covered is covered with an insulating material 8. Thus, a conductive portion is obtained in the insulating substrate.

Since an electric lead or an electrode is buried in the insulating substrate in a semiconductor device of the present invention, even if another electric lead is provided on and across the buried electric lead, height at a solid crossing is less than that in a conventional device. Therefore, disconnection of leads is decreased and further color shade, which originates from ununiformity in thickness of a liquid crystal cell, is decreased in the device formed in accordance with the present invention.

BRIEF DESCRIPTION OF THE DRAWINGS

The present invention will now be described with reference to the accompanying drawings wherein.

DETAILED DESCRIPTION OF THE PREFERRED EMBODIMENTS

Embodiment 1

Figure 1A:
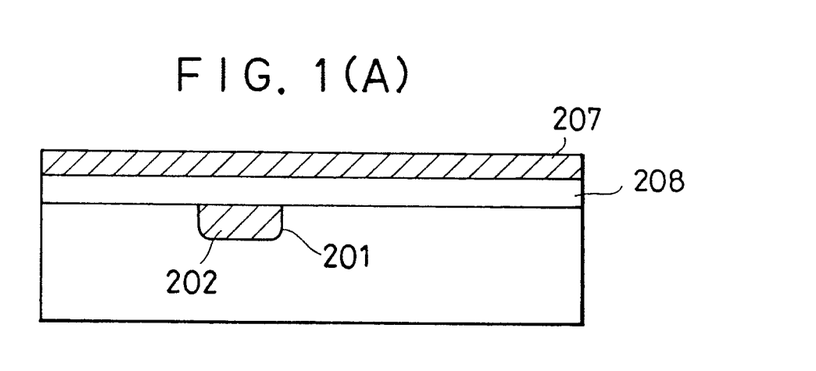
FIGS. 1(A) through 1(C) show a cross section and a plan of a semiconductor device in accordance with the present invention.
Figure 1B:
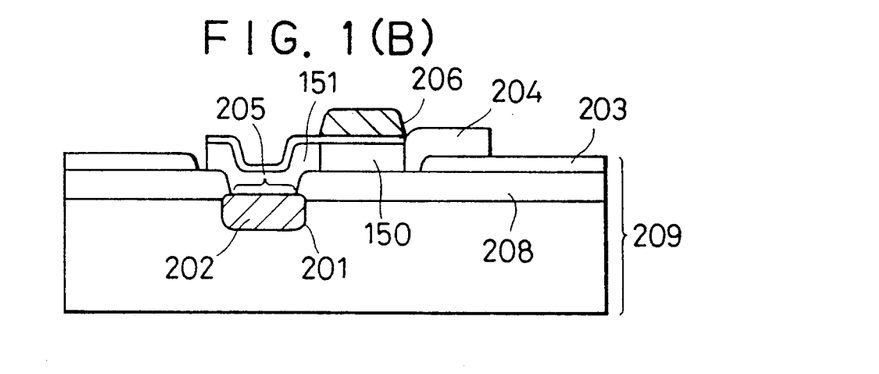
Figure 1C:
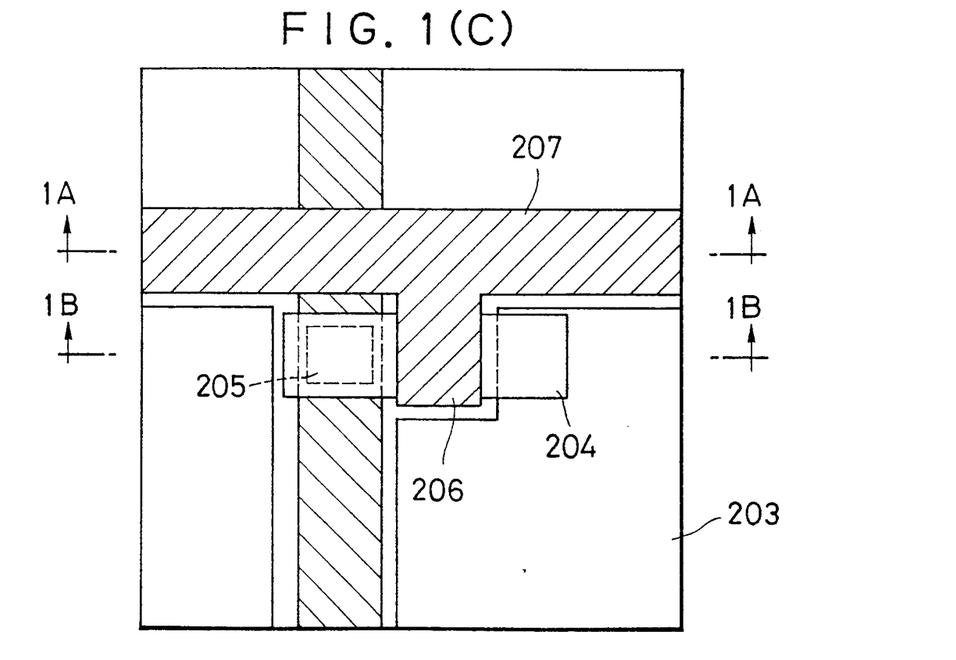

FIG. 1(A) shows a cross section of a solid crossing of electrodes in a semiconductor device in accordance with this embodiment, and FIGS. 1(B) and (C) are a cross sectional view and a plan view showing a semiconductor device comprised of an active matrix type liquid crystal device in accordance with this embodiment.

A soda-lime glass is utilized as a substrate in this embodiment. A resist film pattern is formed on the substrate by photolithography technique. The substrate is then subjected to etching by the use of hydrofluoric acid with the patterned resist film as a mask, whereby a depression 201 is obtained. The depression 201 has 30 $\mu$m width and 2 $\mu$m depth.

Then, an aluminum film is formed on the substrate by DC sputtering with the resist film provided thereon and is patterned to form a source electrode 202 in the depression 201 by lift-off method.

Then, an insulating film 208 made of SiO$_2$ is formed to be 2 $\mu$m thick on the glass substrate by AC sputtering, and subsequently an opening 205 for connecting the source electrode 202 to a semiconductor device to be formed on the substrate is formed by photolithography technique.

The insulating film 208 may be formed on the entire surface of the substrate or on a portion thereof. In the case of forming an insulating film 208 made of silicon oxide on the entire surface of the substrate, the film prevents alkali ions residing in the glass substrate from coming out to a thin film transistor to be formed on the substrate. Therefore, reliability of the thin film transistor is improved. Alternatively, an insulating organic material, e.g. polyimide resin, may be utilized for an insulating film 208. Since an organic material is superior in leveling, the substrate surface under which an electrode has been buried can be made planar with the organic material.

Then, an ITO film is formed by DC sputtering and etched by photolithography technique to form a pixel electrode 203.

After that, an amorphous silicon film and an SiN film are formed by plasma CVD under a pressure of 0.02 Torr at a flow rate of SiH$_4$ of 20 SCCM at an electric power of 5 W. The thicknesses of the a-Si film and the SiN film are 3000 Å and 700 Å, respectively. The films are etched by photolithography technique.

Further, n-type impurity, for example phosphorus and arsenic, is ion-implanted into the a-Si film by the use of a suitable mask. As a result, a source region 151, a drain region 204, and a channel region 150 located therebetween are formed as shown in FIG. 1(B).

Then, a Mo film is formed by sputtering and patterned by photolithography technique to form a gate electrode 206 and a lead 207 as shown in FIG. 1(C).

An orientation control film 216 made of polyimide is formed by off-set printing. The orientation control film 216 is then subjected to known rubbing treatment in one direction.

The substrate obtained through the above steps is referred to as a first substrate 209 in the description of Embodiment 1.

Figure 2:
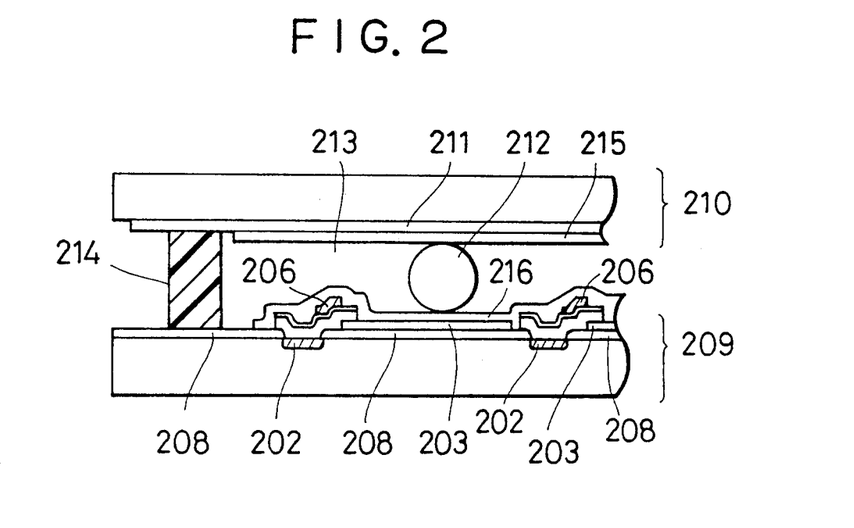
FIG. 2 is a schematic cross sectional view showing a liquid crystal device in accordance with the present invention.

Next, manufacture of a liquid crystal device will be described hereinafter. FIG. 2 shows a cross section of a liquid crystal device in accordance with this embodiment.

As a second substrate 210, a soda-lime glass on which an ITO film is formed and patterned into a common electrode 211 by photolithography technique is used. An orientation control film 215 made of polyimide is formed on the substrate 210 by off-set printing. The orientation control film 215 is subjected to known rubbing treatment.

On the first substrate 209, spacers (micro pearls) 212 of 7.5 $\mu$m$\phi$ are dispersed at a density of 300 particles per 1 mm square. Then, adhesive of epoxy system is screen-printed on the periphery of the second substrate 210 to form a sealing material 214.

The first substrate 209 and the second substrate 210 are arranged so as to face the orientation control films 216 and 215 to each other and then are pressed toward the inside thereof at a pressure of 2 kgf/cm$^2$. At the same time, they are heated at 160° C. for 60 minutes in order to harden the adhesive. A liquid crystal cell is thus composed.

Then, nematic liquid crystal 213 is injected into the liquid crystal cell via an injection port by vacuum injection method. After that, the liquid crystal injection port is sealed with UV light hardening resin, whereby a liquid crystal device is completed.

In this embodiment, a source electrode and a lead extending therefrom are buried in a glass substrate. Therefore a solid crossing of this lead and a lead extending from a gate electrode is made thin, and accordingly a liquid crystal device comprising a liquid crystal cell of uniform thickness, i.e. a liquid crystal device free from color shade, is obtained.

In the foregoing description of Embodiment 1, an impurity region 151, an impurity region 204, and an electrode 202 are used as a source region, a drain region, and a source electrode respectively, however, the impurity region 151, the impurity region 204, and an electrode 202 can be used as a drain region, a source region, and a drain electrode respectively depending on application.

Embodiment 2

Figure 3A:
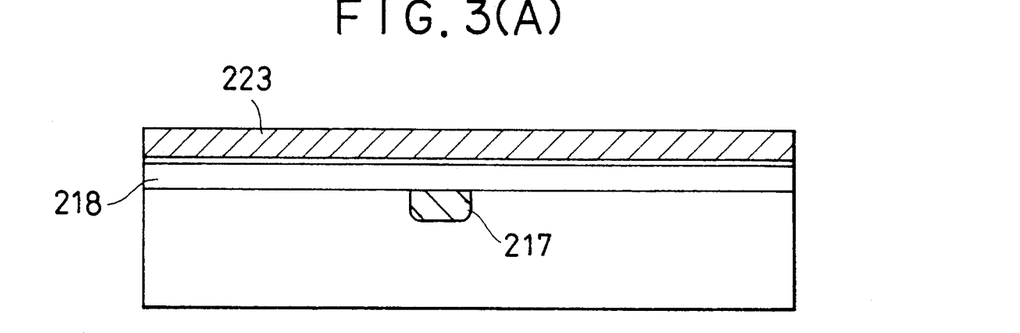
FIGS. 3(A) through 3(C) show a cross section and a plan of another semiconductor device in accordance with the present invention.
Figure 3B:
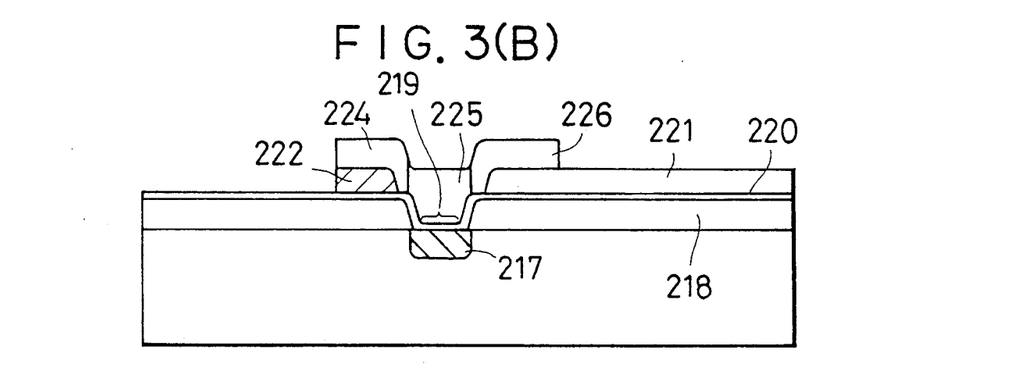
Figure 3C:
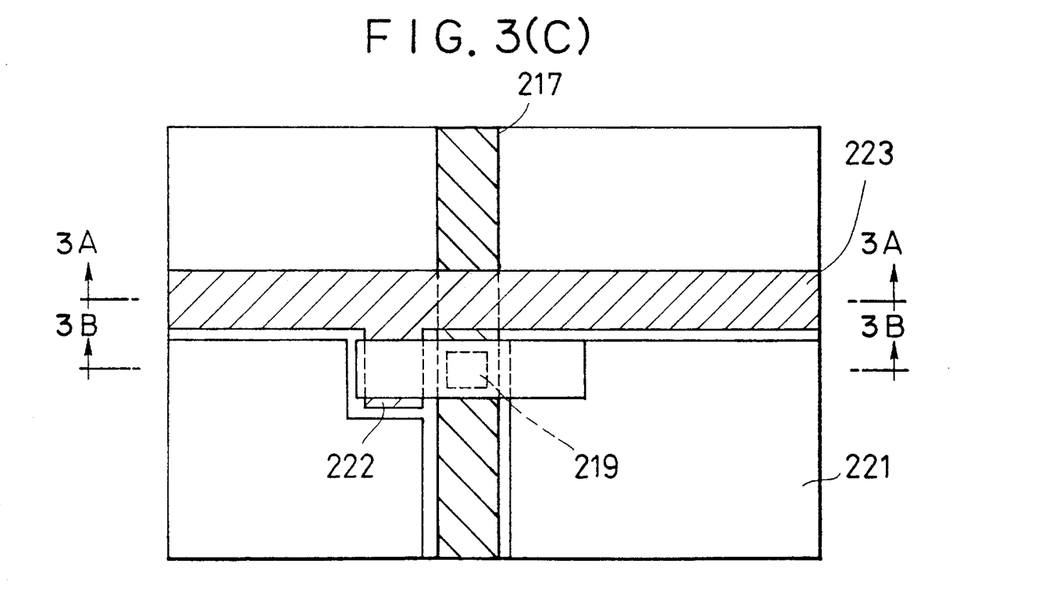

FIG. 3(A) shows a cross section of a solid crossing of electrodes in a semiconductor device in accordance with this embodiment, and FIGS. 3(B) and (C) are a cross sectional view and a plan view showing a semiconductor device comprised of an active matrix type liquid crystal device in accordance with this embodiment.

A soda-lime glass is utilized as a substrate in this embodiment. A resist film pattern is formed on the substrate by photolithography technique. The substrate is then subjected to etching by the use of hydrofluoric acid with the patterned resist as a mask, whereby a depression is obtained. The depression has 10 $\mu$m width and 2 $\mu$m depth.

Then, an aluminum film is formed on the substrate with the resist film provided thereon by DC sputtering and is patterned to form a gate electrode 217 in the depression by lift-off method.

On the glass substrate, a polyimide resin film is formed to be 2 $\mu$m thick by spinner and is pre-baked. Then, an opening 219 is formed in the polyimide resin film by photolithography technique. The polyimide resin film on the substrate is then baked, whereby an insulating film 218 shown in FIG. 3(B) is obtained.

After that, a SiN$_x$ layer 220 to be a gate insulating layer is formed to be 1000 Å thick by photo CVD.

On the layer 220 an ITO film is formed by DC sputtering and then patterned into a pixel electrode 221 by photolithography technique.

Then, a Mo film is formed by DC sputtering and patterned into a source electrode 222 and a lead 223 by photolithography technique as shown in FIG. 3(C).

Then, an amorphous silicon film is formed to be 3000 Å by plasma CVD under a pressure of 0.02 Torr at a flow rate of SiH$_4$ of 20 SCCM at an electric power of 5 W. The amorphous silicon film is patterned by photolithography technique and an n-type impurity, for example phosphorus and arsenic, is ion-implanted into the patterned amorphous silicon film by the use of a suitable mask. As a result, a source region 224, a drain region 226, and a channel region 225 located therebetween are formed as shown in FIG. 3(B).

An orientation control film 225 made of polyimide is formed by off-set printing. The orientation control film 225 is then subjected to known rubbing treatment in one direction.

The substrate obtained through the above steps is referred to as a first substrate 226 in the description of Embodiment 2.

Figure 4:
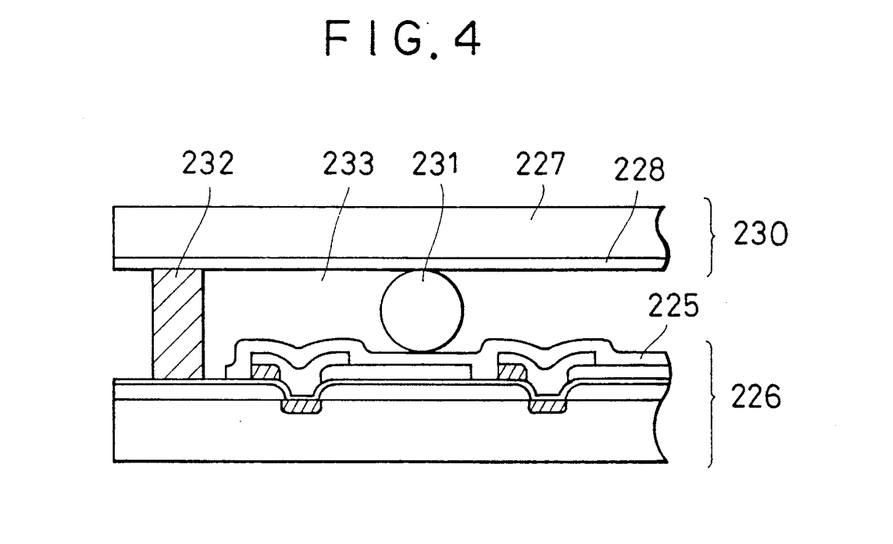
FIG. 4 is another schematic cross sectional view showing a liquid crystal device in accordance with the present invention.

Next, manufacture of a liquid crystal device will be described hereinafter. FIG. 4 shows a cross section of a liquid crystal device in accordance with this embodiment.

As a second substrate 230, a soda-lime glass 227 on which an ITO film is formed by DC sputtering and patterned into a common electrode 228 by photolithography technique is used.

On the first substrate 226, spacers (micro pearls) 231 of 7.5 μmφ are dispersed at a density of 300 particles per 1 mm square. Then, adhesive of epoxy system is screen-printed on the periphery of the second substrate 230 to form a sealing material 232.

The first substrate 226 and the second substrate 230 are arranged so as to face the orientation control film 225 and the common electrode 228 to each other and then are pressed toward the inside thereof at a pressure of 2 kgf/cm$^2$. At the same time, they are heated at 160° C. for 60 minutes in order to harden the adhesive. A liquid crystal cell is thus composed.

Then, a ferroelectric liquid crystal 233 is injected into the liquid crystal cell via an injection port by vacuum injection method. The liquid crystal injection port is sealed with UV light hardening resin, whereby a liquid crystal device is completed.

In this embodiment, a gate electrode is buried in a glass substrate. As a result, a liquid crystal device free from color shade is obtained as in Embodiment 1.

Embodiment 3

In this embodiment, a dispersion type liquid crystal display device, in which nematic liquid crystal dispersed in epoxy transformed acrylic resin is utilized and transmission and diffusion of light is controlled by electric fields, is composed as a projection type display device. In this display device, p-channel thin film transistors and n-channel thin film transistors in accordance with the present invention are combined complimentarily.

Figure 7A:
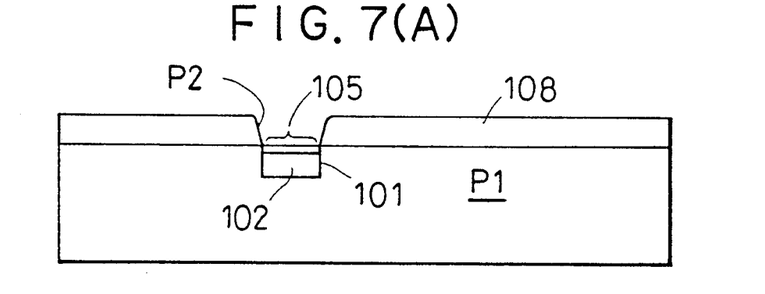
FIGS. 7(A) through (D) show manufacturing steps of an active matrix type semiconductor device in accordance with the present invention and FIGS. 7(E) and (F) show a plan and a cross section of complimentary thin film transistors in accordance with the present invention.
Figure 7B:
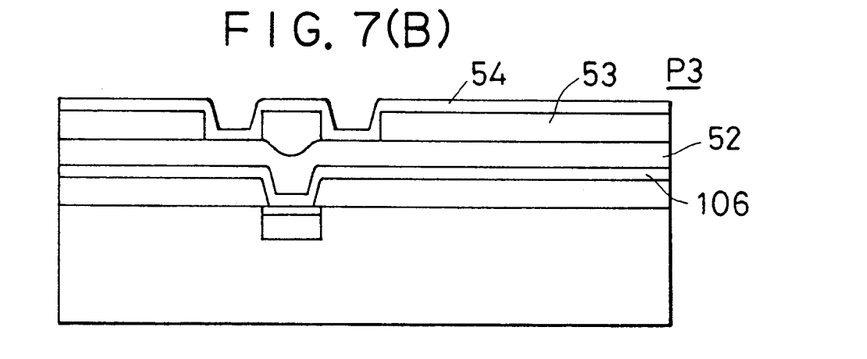
Figure 7C:
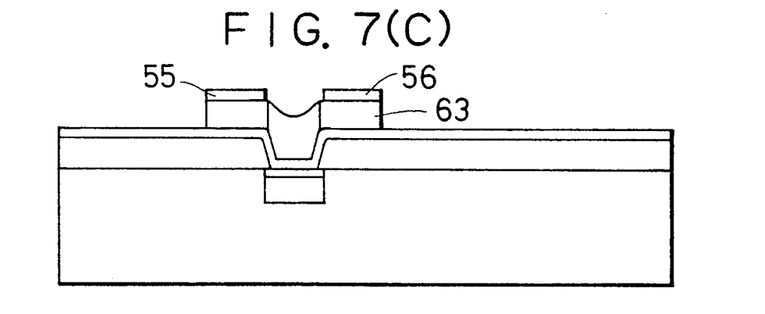
Figure 7D:
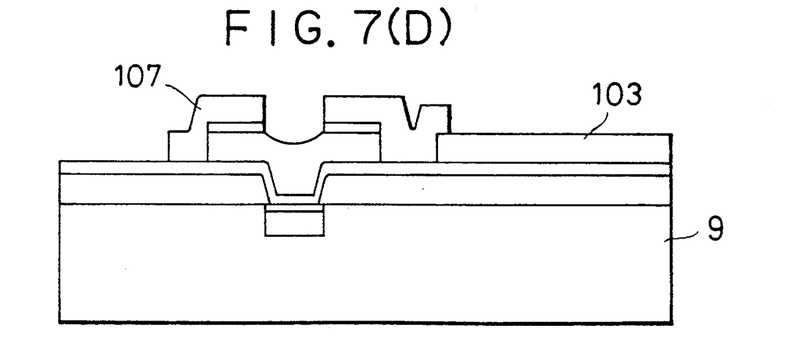
Figure 7E:
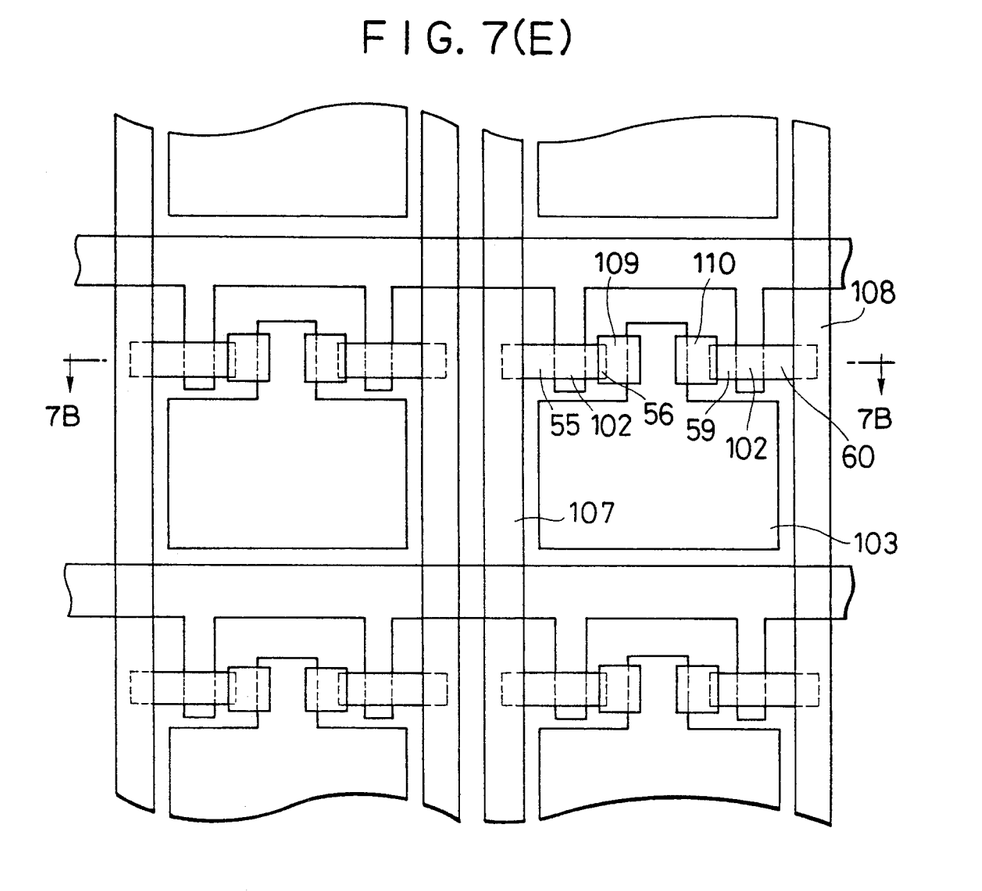
Figure 7F:
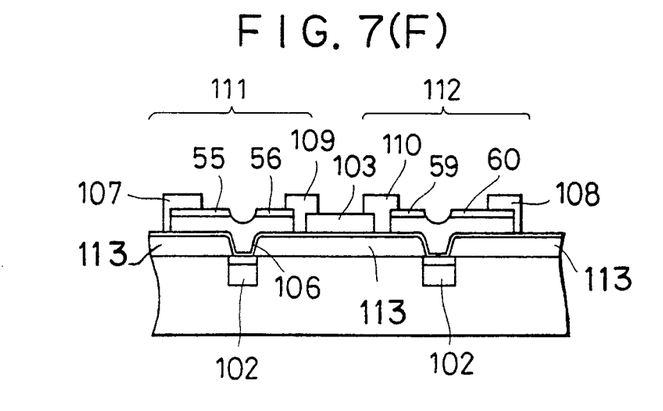

FIG. 7(E) is a plan view showing complimentary TFTs in an active matrix type liquid crystal device in accordance with the present invention, and FIG. 7(F) shows a cross section of complimentary TFTs at B—B' line in FIG. 7(E). Only a pair of p-channel field effect transistor 112 and n-channel field effect transistor 111 are shown in FIG. 7(F) although two pairs of p-channel field effect transistors and n-channel field effect transistors are shown in FIG. 7(E) along B—B' line. Manufacturing steps of the complimentary TFTs are illustrated in FIGS. 7(A) to (D).

A resist film pattern is formed on a soda-lime glass substrate by photolithography technique utilizing a photomask P1. The substrate is then subjected to etching by the use of hydrofluoric acid with the resist film pattern, whereby a depression 101 is obtained. The depression has 30 μm width and 2 μm depth.

Then, an aluminum film is formed on the substrate with the resist film provided thereon by DC sputtering and is patterned to form a gate electrode 102 in the depression 101 by lift-off method. The surface of the electrode 102 is oxidized by anodic oxidation method, and subsequently an insulating film portion made of silicon oxide is formed to be 2 μm thick on the substrate by magnetron RF sputtering in an atmosphere of 100% oxygen at a film formation temperature of 15° C. at an output power of 400-800 W at a pressure of 0.5 Pa. In the case that quartz or single-crystalline silicon is utilized as a target, film formation rate is 30-100 Å/min. Then, an opening 105 for connecting the electrode 102 to a thin film transistor to be formed on the substrate is formed in the insulating film portion by photolithography technique.

The insulating film portion may be formed on the entire surface of the substrate or on a portion thereof. In the case of forming an insulating film portion made of silicon oxide on the entire surface of the substrate, the film prevents alkali ions residing in the glass substrate from coming out to thin film transistors formed on the substrate. Therefore, reliability of the thin film transistor is improved. Unless high temperature treatment is utilized in subsequent steps, it is possible to use an insulating organic material, e.g. polyimide resin, for an insulating film portion. Since an organic material is superior in leveling, the substrate surface under which electric leads have been buried can be made planar with the organic material.

Then, as a gate insulating film 106, silicon oxide film is formed to be 1000-3000 Å on the insulating film portion by magnetron RF (high frequency) sputtering in an atmosphere of 100% oxygen at a film formation temperature of 15° C. at an output power of 400-800 W at a pressure of 0.5 Pa. In the case of utilizing quartz or single-crystalline silicon as a target, film formation rate is 30-100 Å/min.

On the gate insulating film 106, a silicon film 52 is formed by plasma CVD at a film formation temperature of 250°-350° C., e.g. 320° C. in this embodiment, by making use of monosilane (SiH$_4$). Disilane (Si$_2$H$_6$) or trisilane (Si$_3$H$_8$) may be utilized in place of monosilane. The monosilane is introduced into a PCVD apparatus at a pressure of 3 Pa and also a high frequency electric power having a frequency of 13.56 MHz is inputted thereto at 0.02-0.10 W/cm$^2$, e.g. 0.055 W/cm$^2$ in this embodiment. Flow rate of the monosilane (SiH$_4$) is maintained at 20 SCCM, and at this moment film formation rate is about 120 Å/min. In order to make threshold voltages (Vth) of p-type TFT and n-type TFT approximately same, diborane at a concentration of $1 \times 10^{15} - 1 \times 10^{18}$ cm$^{-3}$ may be added during formation of the silicon film 52 to add boron thereto. The silicon film 52 to become a channel region of a TFT may be formed by sputtering and reduced pressure CVD as well as the above plasma CVD.

In the case of formation of the silicon film 52 by sputtering, back pressure before sputtering process is maintained at $1 \times 10^{-5}$ Pa or less. The sputtering is carried out in an atmosphere of argon mixed with hydrogen at 20-80%, e.g. in an atmosphere comprising argon at 20% and hydrogen at 80%, by making use of single crystalline silicon as a target. During the formation of the silicon film 52, temperature is maintained at 150° C., frequency at 13.56 MHz, output power of sputtering at 400-800 W, and pressure at 0.5 Pa.

In the case of formation of the silicon film 52 by reduced pressure CVD, temperature during film formation is maintained at 450°-550° C., e.g. 530° C., which is 100°-200° lower than crystallization temperature thereof, and disilane ($Si_2H_6$) or trisilane ($Si_3H_8$) is introduced into a CVD apparatus. The pressure in a reaction furnace is maintained at 30-300 Pa. The film formation rate is 50-250 Å/min. In order to make threshold voltages (Vth) of a p-type TFT and an n-type TFT approximately same, diborane at a concentration of $1\times10^{15}$-$1\times10^{18}cm^{-3}$ may be added during the formation of the silicon film 52 in order to add boron thereto.

In the silicon film 52 formed by the above methods, oxygen concentration of $5\times10^{21}cm^{-3}$ or less is preferable. For the purpose of promoting crystallization of the silicon film 52 in a subsequent step, oxygen concentration of $7\times10^{19}cm^{-3}$ or less, preferably $1\times10^{19}cm^{-3}$ or less, is desirable. However, if the oxygen concentration is too low, leakage of electric current is increased during the switch of the device OFF due to back light. On the other hand, if the oxygen concentration is too high, it is difficult to crystallize the silicon film 52, and accordingly a higher temperature or a longer period of time is necessary for the crystallization by laser annealing. In the silicon film 52 thus formed, hydrogen is contained at $4\times10^{20}cm^{-3}$, which is 1 atom % compared with silicon concentration of $4\times10^{22}cm^{-3}$.

Alternatively, for promoting crystallization of a channel region compared with source and drain regions, oxygen concentration in the entire film is maintained at $7\times10^{19}cm^{-3}$ or less, preferably $1\times10^{19}cm^{-3}$ or less, and oxygen is added to only the region to be a channel in a TFT by ion implantation so that oxygen concentration at the channel region is $5\times10^{20}$-$5\times10^{21}cm^{-3}$.

In the above manner, a silicon film 52 in amorphous state is formed to be 500-5000 Å thick, e.g. 1000 Å thick in this embodiment, on the gate insulating film 106.

In the case of forming an n-channel TFT, photoresist 53 is formed on the amorphous silicon film 52 except for regions to be source and drain by the use of mask P3, as shown in FIG. 7(B). Further, a silicon layer 54 to be an n-type activation layer is formed by plasma CVD. Temperature during formation of the silicon layer 54 is 250°-350° C., e.g. 320° C. in this embodiment. Monosilane ($SiH_4$) and phosphine ($PH_3$) at 3% are introduced into a PCVD apparatus at a pressure of 5 Pa. An electric power having a frequency of 13.56 MHz is inputted at 0.05-0.20 W/cm$^2$, e.g. 0.120 W/cm$^2$ during the formation of the silicon layer 54. An n-type silicon layer thus formed has specific conductivity of about $2\times10^{-1}\Omega cm^{-1}$. The thickness thereof is 50 Å. Then, the photoresist 53 is removed by lift-off method, whereby source and drain regions 55 and 56 are obtained.

In the case of forming a p-channel TFT, a silicon layer to be a p-type activation layer is formed in the same process as the above. In this case, however, monosilane ($SiH_4$) and diborane ($B_2H_6$) at 5% are introduced to a PCVD apparatus at a pressure of 4 Pa. An electric power having a frequency of 13.56 MHz is inputted at 0.05-0.20 W/cm$^2$, e.g. 0.120 W/cm$^2$ in this embodiment. A p-type silicon layer thus formed has specific conductivity of about $5\times10^{-2}\Omega cm^{-1}$. The thickness thereof is 50 Å. Then, a photoresist pattern is removed by lift-off method as in the case of the n-type silicon layers, whereby source and drain regions 59 and 60 are obtained (FIG. 7(E)). Then, portions of the silicon film 52 are removed by etching.

By the use of XeCl excimer laser, the source, drain, and channel regions are subjected to laser annealing and at the same time the activation layer is subjected to laser doping. Threshold energy of the laser is 130 mJ/cm$^2$. In order to melt the entire silicon film 52 through thickness, laser energy of 220 mJ/cm$^2$ is necessary. However, if the film is irradiated with laser of 220 mJ/cm$^2$ or higher from the beginning, hydrogen involved in the film is discharged rapidly, resulting in destroy of the film. For this reason, in this embodiment, first the film is irradiated with laser of 150 mJ/cm$^2$ to discharge hydrogen therefrom and then irradiated with laser of 230 mJ/cm$^2$ to be crystallized.

By the annealing, crystallinity of the silicon film 52 becomes high and a film which is partially in a crystal state is obtained. Particularly, regions having comparatively high order formed in the silicon film 52 during formation of the film 52 tend to become crystal state regions by the annealing. These regions are connected to each other by means of silicon atoms therebetween, so that silicon atoms pull each other. According to measurement in the silicon film 52 by laser Raman spectroscopic analysis, a sharp peak is observed at a wavenumber of lower frequency side than a wavenumber 522 cm$^{-1}$ which is peculiar to a peak of single crystalline silicon. Apparent grain diameter thereof is calculated to be 50-500 Å from half band width of the sharp peak. However, the silicon film 52 actually comprises numbers of regions of high crystallinity, i.e. clusters, and these regions (clusters) are connected (anchored) to each other by means of silicon atoms.

As a result, the film which essentially has no grain boundaries therein is obtained. Carriers can move easily between clusters via anchoring portions (bonds), therefore carrier mobility in the film is higher than that in a polycrystal silicon film which has grain boundaries therein. Hole mobility ($\mu h$) of the films obtained in this embodiment is 10-200 cm$^2$/Vsec. and electron mobility ($\mu e$) is 15-300 cm$^2$/Vsec.

Thus, all the steps to manufacture a thin film transistor are carried out at 400° C. or lower. Therefore, it is not necessary to use an expensive substrate material such as quartz, so that the manufacturing process in accordance with the present invention is suitable for manufacturing a large-sized liquid crystal display device.

Then, an ITO film is formed by DC sputtering and etched by photolithography technique to be a pixel electrode 103. Further, an aluminum film is formed by sputtering and etched by photolithography technique to be leads 107 and 108 and electrodes 109 and 110.

Thus, an n-channel TFT 111 and a p-channel TFT 112 are manufactured.

The substrate obtained through the above steps is referred to as a first substrate 9 hereinafter.

Figure 8:
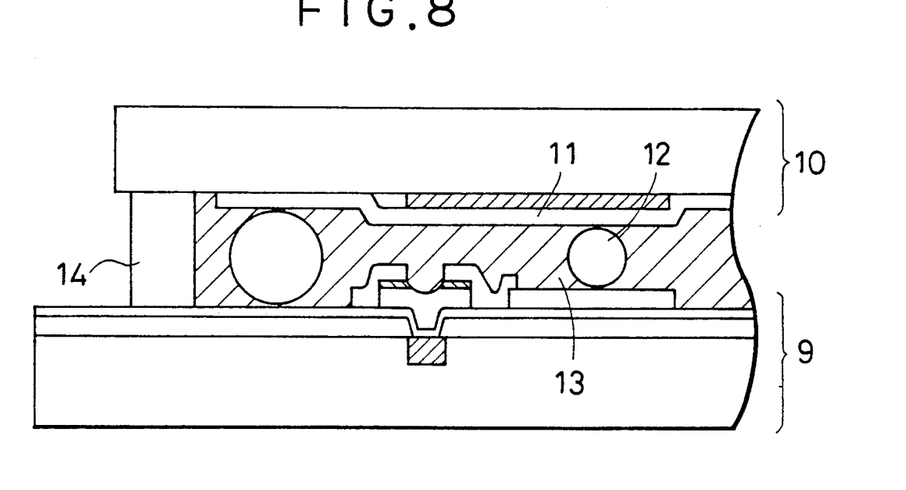
FIG. 8 is a further schematic cross sectional view showing a liquid crystal device in accordance with the present invention.

Next, manufacture of a liquid crystal device will be described hereinafter. FIG. 8 shows a cross section of a liquid crystal device in accordance with this embodiment.

As a second substrate 10, a soda-lime glass having color filters on which an ITO film is formed and patterned by photolithography technique into a common electrode 11 is used.

On the first substrate 9, spacers (micro pearls) 12 of 7.5 $\mu m\phi$ are dispersed at a density of 300 particles per 1 mm square. Then, adhesive of epoxy system is screen-printed on the periphery of the second substrate to form a sealing material 14.

The first substrate and the second substrate are arranged so as to face the device side and the color filter side to each other and then are pressed toward the inside thereof at a pressure of 2 kgf/cm². At the same time, they are heated at 160° C. for 60 minutes in order to harden the adhesive. A liquid crystal cell is thus composed.

A material comprising epoxy transformed acrylic resin to be hardened by UV light and nematic liquid crystal at a ratio of 6:4 is injected into the liquid crystal cell via an injection port by vacuum injection method. The liquid crystal cell is heated uniformly at 65° C. and at the same time is irradiated with a light containing at least UV light of 313 nm wavelength at 1500 mJ, whereby the epoxy transformed acrylic resin is hardened. As the resin is hardened, the liquid crystal material is separated from the resin and liquid crystal grains of 1–3 μm are formed. Depending on combinations of resins and liquid crystal materials, the liquid crystal may become fiber shape, instead of grain shape. In any cases, when external electric fields are not applied to liquid crystal molecules, the liquid crystal molecules are oriented at random since the surface of the separated liquid crystal touches the resin. Therefore, light emitted to the liquid crystal cell from the outside is dispersed by the liquid crystal molecules oriented at random. When external electric fields are applied thereto, liquid crystal molecules are aligned in accordance with the direction of the applied electric field, therefore light emitted from the outside is transmitted by the cell.

The liquid crystal injection port is sealed with UV light hardening resin, whereby a liquid crystal device is completed.

Thus, a liquid crystal device comprising p-channel TFTs and n-channel TFTs which are combined complimentarily and whose gate electrodes and leads extending therefrom are buried in a substrate is manufactured.

Figure 9:
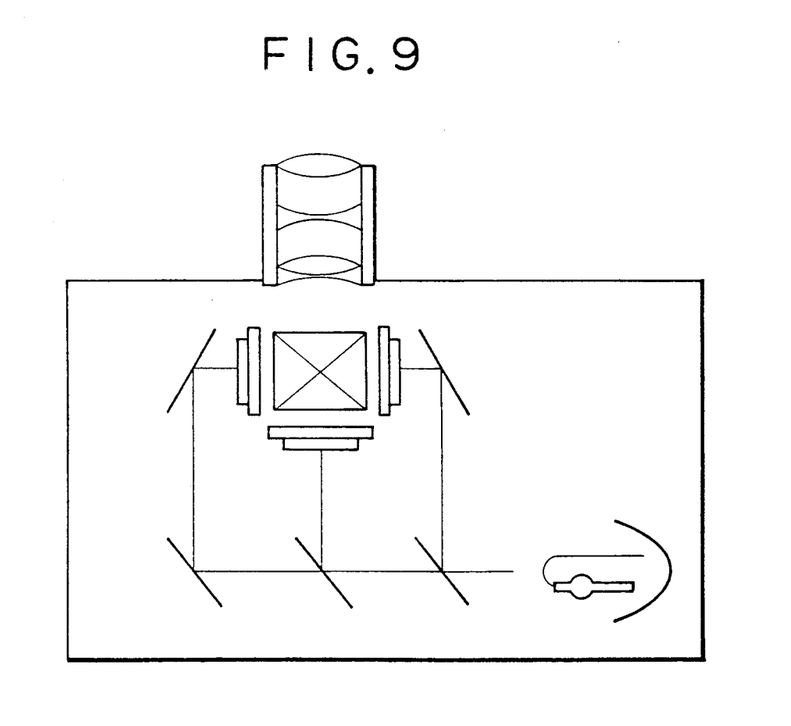
FIG. 9 is a view showing a liquid crystal display device of projection type comprising a liquid crystal cell manufactured in accordance with the present invention.

A liquid crystal display device of projection type utilizing a liquid crystal cell in accordance with this embodiment is illustrated in FIG. 9.

The foregoing description of preferred embodiments has been presented for purposes of illustration and description. It is not intended to be exhaustive or to limit the invention to the precise form described, and obviously many modifications and variations are possible in light of the above teaching. The embodiment was chosen in order to explain most clearly the principles of the invention and its practical application thereby to enable others in the art to utilize most effectively the invention in various embodiments and with various modifications as are suited to the particular use contemplated. For example, thin film transistors of any types other than inverse stagger type may be manufactured in accordance with the present invention. In the foregoing embodiments, either of a source electrode or a gate electrode is buried in a glass substrate. However, it is possible to bury both of a source electrode and a gate electrode in a glass substrate to thereby obtain a planar surface of a substrate.

What is claimed is:
1. A semiconductor device comprising:
a substrate having a flat insulating upper surface; and
an electric lead formed of a film of a conductive material, at least a portion of said film being buried in the insulating portion of said substrate.

2. The semiconductor device of claim 1 wherein the upper surface of said electric lead is substantially flush with said flat surface.

3. The semiconductor device of claim 1 wherein said electric lead is connected to a semiconductor device provided on said substrate.

4. A semiconductor device comprising:
an insulating substrate having a depression in a flat surface thereof;
a source electrode provided in said depression;
a semiconductor layer provided on said insulating substrate and said source electrode;
source and drain regions provided in said semiconductor layer;
a gate electrode provided on said semiconductor layer with a gate insulating film therebetween; and
a channel region located between said source and drain regions.

5. The semiconductor device of claim 4 further comprising an electrode provided on said insulating substrate and connected to said drain region.

6. The semiconductor device of claim 4 wherein said source electrode is connected to said source region.

7. The semiconductor device of claim 4 wherein said insulating substrate is used as one of a pair of substrates constituting a liquid crystal device.

8. A semiconductor device comprising:
an insulating substrate having a depression in a flat surface thereof;
a gate electrode provided in said depression;
a semiconductor layer provided on said insulating substrate and said gate electrode with a gate insulating film therebetween;
source and drain regions provided in said semiconductor layer; and
a channel region located between said source and drain regions.

9. The semiconductor device of claim 8 further comprising a source electrode connected to said source region.

10. The semiconductor device of claim 8 further comprising an electrode provided on said insulating substrate and connected to said drain region.

11. The semiconductor device of claim 8 wherein said insulating substrate is used as one of a pair of substrates constituting a liquid crystal device.

12. A semiconductor device provided on an insulating substrate having a depression in a flat surface thereof, said semiconductor device comprising:
complimentary transistors provided on said insulating substrate; and
an electric lead provided in said depression and connected to at least one of said transistors.

13. The semiconductor device of claim 12 wherein said complimentary transistors comprise a p-channel field effect transistor and an n-channel field effect transistor.

14. The semiconductor device of claim 13 wherein said electric lead comprises a shortened gate electrode connected to said one of said p-channel and n-channel field effect transistors.

15. The semiconductor device of claim 14 wherein said p-channel and n-channel field effect transistors comprise semiconductor layers provided on said insulating substrate and said shortened gate electrode with a gate insulating film therebetween, source and drain regions provided in said semiconductor layers, and channel regions located between said source and drain regions.

16. A semiconductor device comprising:
an insulating substrate having a depression in a flat surface thereof;
a drain electrode provided in said depression;
a semiconductor layer provided on said insulating substrate and said drain electrode;
source and drain regions provided in said semiconductor layer;
a gate electrode provided on said semiconductor layer with a gate insulating film therebetween; and
a channel region located between said source and drain regions.

17. The semiconductor device of claim 16 further comprising an electrode provided on said insulating substrate and connected to said source region.

18. The semiconductor device of claim 16 wherein said drain electrode is connected to said drain region.

19. The semiconductor device of claim 16 wherein said insulating substrate is used as one of a pair of substrates constituting a liquid crystal device.

* * * * *